United States Patent [19]

Kawashima et al.

[11] Patent Number: 4,839,803

[45] Date of Patent: Jun. 13, 1989

[54] PLANNING SUPPORT METHOD AND SYSTEM

[75] Inventors: Kazuhiro Kawashima, Yokohama; Norihisa Komoda, Kawasaki; Shunichi Harada, Yokohama; Sadamichi Mitsumori, Hachioji; Kouichi Taniguchi, Kawasaki, all of Japan

[73] Assignee: Hitachi, Ltd., Tokyo, Japan

[21] Appl. No.: 84,514

[22] Filed: Aug. 10, 1987

[30] Foreign Application Priority Data

Sep. 5, 1986 [JP] Japan ................................ 61-207870
Apr. 10, 1987 [JP] Japan ................................ 62-86852

[51] Int. Cl.⁴ ............................................ G06F 15/21
[52] U.S. Cl. .................................... 364/403; 364/468
[58] Field of Search ........................ 364/403, 401, 468

[56] References Cited

U.S. PATENT DOCUMENTS 4,449,180  5/1984  Oshima et al. ...................... 364/147
4,646,238  2/1987  Carlson, Jr. et al. ............... 364/403

FOREIGN PATENT DOCUMENTS 0049176   4/1982  European Pat. Off. .
021825    8/1987  European Pat. Off. .
1339028  11/1973  United Kingdom .
1405353   4/1975  United Kingdom .
2177826   1/1987  United Kingdom .

Primary Examiner—Allen Macdonald
Attorney, Agent, or Firm—Fay, Sharpe, Beall, Fagan, Minnich & McKee

[57] ABSTRACT

With the aim of designing efficiently and quickly such plans as production plans having a variety of requirements involved and requiring frequent modification of software, a planning logic prepared without regard to the preparation sequence of a plan is converted into a planning program. Upon the conversion, the planning logic is edited so that only part of the planning logic requiring modification may be modified, and a result of modification is displayed on a screen so as to be checked through a display.

20 Claims, 18 Drawing Sheets t = 5mm

| LINE NO. | 1ST TERM | 2ND TERM | 3RD TERM | 4TH TERM | 5TH TERM | 6TH TERM |
|---|---|---|---|---|---|---|
| 1 | ALLOTMENT COST | = | MATERIAL COST | + | WORKING COST | |
| 2 | WORKING COST | = | PLATE LENGTH WORKING COST | + | PLATE WIDTH WORKING COST | |
| 3 | PLATE LENGTH DIFFERENCE | = | MATERIAL PLATE LENGTH | − | ORDERED PLATE LENGTH | |
| 4 | IF | PLATE LENGTH DIFFERENCE | ≤ | CONST1 | | |
| 5 | THEN | PLATE LENGTH WORKING COST | = | CONST2 | | |
| 6 | ELSE | PLATE LENGTH WORKING COST | = | CONST3 | * | MATERIAL PLATE WIDTH |
| 7 | IF | MATERIAL PLATE WIDTH | = | ORDERED PLATE WIDTH | | |
| 8 | THEN | PLATE WIDTH WORKING COST | = | CONST 4 | | |
| 9 | ELSE | PLATE WIDTH WORKING COST | = | CONST 5 | * | ORDERED PLATE LENGTH |
| 10 | ... | ... | ... | ... | ... | ... |

FIG. 3A

ORDER

| ORDER NO. | ORDERED PLATE WIDTH | ORDERED PLATE LENGTH |
|---|---|---|
| C1 | 1100 | 2000 |
| C2 | 1150 | 2000 |
| C3 | 1150 | 2050 |
| C4 | 1180 | 2050 |
| C5 | 1180 | 2080 |
| C6 | 1200 | 2100 |
| --- | ---- | ---- |

MATERIAL

| MATERIAL NO. | MATERIAL PLATE WIDTH | MATERIAL PLATE LENGTH | MATERIAL COST |
|---|---|---|---|
| Z1 | 1200 | 2100 | 1000 |
| Z2 | 1200 | 2150 | 1050 |
| Z3 | 1200 | 2200 | 1100 |
| Z4 | 1220 | 2100 | 1050 |
| Z5 | 1220 | 2150 | 1150 |
| Z6 | 1200 | 2180 | 1050 |
| --- | --- | --- | --- |

| ORDER NO. | MATERIAL NO. |
|---|---|
| C1 | Z3 |
| C2 | Z2 |
| C3 | Z1 |
| C4 | Z95 |
| ----- | ----- |
| ----- | ----- |
| ----- | ----- |
| ----- | ----- |
| C51 | Z76 |
| C52 | Z96 |

| LINE NO. | CALCULATION FORMULA | POINTER |
|---|---|---|
| 1 | ALLOTMENT COST = MATERIAL COST + WORKING COST | 1 |
| 2 | WORKING COST = PLATE LENGTH WORKING COST + PLATE WIDTH WORKING COST | 1 |
| 3 | PLATE LENGTH DIFFERENCE = MATERIAL PLATE LENGTH − ORDERED PLATE LENGTH | 1 |
| 4 | IF PLATE LENGTH ≤ 50 | 2 |
| 5 | THEN PLATE LENGTH WORKING COST = 0.1 | 3 |
| 6 | ELSE PLATE LENGTH WORKING COST = 0.4 * MATERIAL PLATE WIDTH | 4 |
| 7 | IF MATERIAL PLATE WIDTH = ORDERED PLATE WIDTH | 2 |
| 8 | THEN PLATE LENGTH WORKING COST = 0 | 3 |
| 9 | ELSE PLATE LENGTH WORKING COST = 0.3 * ORDERED PLATE LENGTH | 4 |
| 10 | | |

FIG. 6A (INFORMATION SORTING)

| SORTING | INFORMATION NAME | DATA AMOUNT ||  |
|---|---|---|---|---|
|  |  | RECORD LENGTH | NUMBER OF EVENTS | ----- |
| (a) | ORDER | 200 | 100 | ----- |
| (b) | MATERIAL | 150 | 2000 |  |

601　602　603　604

FIG. 6B (INFORMATION CONTENTS)

| INFORMATION SORTING | DATA | DATA LENGTH | STORAGE POSITION |  |
|---|---|---|---|---|
| (a) | ORDER NO. | 5 | 1 | ----- |
| (a) | ORDERED PLATE WIDTH | 10 | 6 | ----- |
| (a) | ORDERED PLATE LENGTH | 10 | 16 | ----- |
| ---- | ----- | ---- | ---- | ----- |
| (b) | MATERIAL NO. | 5 | 1 | ----- |
| (b) | MATERIAL PLATE WIDTH | 10 | 6 | ----- |
| (b) | MATERIAL PLATE LENGTH | 10 | 16 | ----- |
| (b) | MATERIAL COST | 10 | 26 | ----- |
| ---- | ----- | ---- | ---- | ----- |

| DEFINED VARIABLE NAME | UNDEFINED VARIABLE NAME | | LINE NO. |
|---|---|---|---|
| ALLOTMENT COST | WORKING COST | | 1 |
| WORKING COST | PLATE LENGTH WORKING COST | PLATE WIDTH WORKING COST | 2 |
| PLATE LENGTH DIFFERENCE | | | 3 |
| PLATE LENGTH WORKING COST | PLATE LENGTH DIFFERENCE | | 4 — 9 |
| PLATE WIDTH WORKING COST | | | 10 — 12 |
| ---- | ---- | ---- | ---- |

| CALCULATION VARIABLE NAME | LINE NO. |
|---|---|
| PLATE LENGTH DIFFERENCE | 3 |
| PLATE LENGTH WORKING COST | 4 — 9 |
| PLATE WIDTH WORKING COST | 10 — 12 |
| WORKING COST | 2 |
| ALLOTMENT COST | 1 |
| | |

| C1 | 1110 | 2000 |  |  |
|---|---|---|---|---|

~1111

| Z1 | 1200 | 2100 | 1000 |  |
|---|---|---|---|---|

| C1 | 1110 | 2000 |  |  |
|---|---|---|---|---|
| C2 | 1150 | 2000 |  |  |
| C3 | 1150 | 2050 |  |  |
| C4 | 1180 | 2050 |  |  |
| C5 | 1180 | 2080 |  |  |
| --- | --- | --- |  |  |

~1121

| Z1 | 1200 | 2100 | 1000 |  |
|---|---|---|---|---|
| Z2 | 1200 | 2150 | 1050 |  |
| Z3 | 1200 | 2200 | 1100 |  |
| Z4 | 1220 | 2100 | 1050 |  |
| Z5 | 1220 | 2150 | 1150 |  |
| Z6 | 1200 | 2180 | 1050 |  |
| --- | --- | --- |  |  |

~1122

FIG. IIC

| C1 | 1110 | 2000 | | | ~1131 |
|----|------|------|------|---|---|
| Z1 | 1200 | 2100 | 1000 | | |
| Z2 | 1200 | 2150 | 1050 | | |
| Z3 | 1200 | 2200 | 1100 | | |
| Z4 | 1220 | 2100 | 1050 | | |
| Z5 | 1220 | 2150 | 1150 | | |
| Z6 | 1200 | 2180 | 1050 | | |
| ---- | ---- | ---- | ---- | | ~1132 |

FIG. IID

| C1 | 1110 | 2000 | | | |
|----|------|------|---|---|---|
| C2 | 1150 | 2000 | | | |
| C3 | 1150 | 2050 | | | |
| C4 | 1180 | 2050 | | | |
| C5 | 1180 | 2080 | | | |
| ---- | ---- | ---- | | | ~1141 |
| Z1 | 1200 | 2100 | 1000 | | ~1142 |

FIG. 12

| | |
|---|---|
| DCL ORDER NO. (100), ORDERED PLATE WIDTH (100), ORDERED PLATE LENGTH (100); | ~1201 |
| DCL MATERIAL NO., ORDERED PLATE WIDTH, ORDERED PLATE LENGTH, MATERIAL COST; | ~1202 |
| DO I = 1 TO 100; | ~1203 |
| READ ORDER NO.(I), ORDERED PLATE WIDTH (I), ORDERED PLATE LENGTH (I); | ~1204 |
| END; | ~1205 |
| DO J = 1 TO 2000; | ~1206 |
| READ MATERIAL NO., MATERIAL PLATE WIDTH, MATERIAL PLATE LENGTH, MATERIAL COST; | ~1207 |
| DO I = 1 TO 100; | ~1208 |
| PLATE LENGTH DIFFERENCE = MATERIAL PLATE LENGTH − ORDERED PLATE LENGTH (I); | ~1209 |
| IF PLATE LENGTH DIFFERENCE = 0 THEN PLATE LENGTH WORKING COST = 0; ELSE IF 0 < PLATE LENGTH DIFFERENCE ≦ 50 THEN PLATE LENGTH WORKING COST = 0.1; ELSE IF 50 ≦ PLATE LENGTH DIFFERENCE THEN PLATE LENGTH WORKING COST = 0.4 * MATERIAL PLATE WIDTH; | ~1210 |
| IF MATERIAL PLATE WIDTH = ORDERED PLATE WIDTH (I) THEN PLATE WIDTH WORKING COST = 0; ELSE PLATE WIDTH WORKING COST = 0.3 * ORDERED PLATE LENGTH (I); | ~1211 |
| WORKING COST = PLATE LENGTH WORKING COST; | ~1212 |
| ALLOTMENT COST = MATERIAL COST + WORKING COST; | ~1213 |
| WRITE ORDER NO. (I), MATERIAL NO. (I), ALLOTMENT COST; | ~1214 |
| END; | ~1215 |
| END; | ~1216 |

FIG. 16A BEFORE MODIFICATION

| LINE NO. | 1ST TERM | 2ND TERM | 3RD TERM | 4TH TERM | 5TH TERM | 6TH TERM |
|---|---|---|---|---|---|---|
| 6 | ELSE | PLATE LENGTH WORKING COST | = | 0.4 | * | MATERIAL PLATE LENGTH |

FIG. 16B AFTER MODIFICATION (MODIFIED CONSTANT)

| LINE NO. | 1ST TERM | 2ND TERM | 3RD TERM | 4TH TERM | 5TH TERM | 6TH TERM |
|---|---|---|---|---|---|---|
| 6 | ELSE | PLATE LENGTH WORKING COST | = | 0.5 | * | MATERIAL PLATE LENGTH |

FIG. 16C AFTER MODIFICATION (MODIFIED LOGIC)

| LINE NO. | 1ST TERM | 2ND TERM | 3RD TERM | 4TH TERM | 5TH TERM | 6TH TERM |
|---|---|---|---|---|---|---|
| 6 | ELSE | PLATE LENGTH WORKING COST | = | 0.4 | + | MATERIAL PLATE LENGTH |

FIG. 17

| LINE NO. | 1ST TERM | 2ND TERM | 3RD TERM | 4TH TERM | 5TH TERM | 6TH TERM |
|---|---|---|---|---|---|---|
| 1 | ALLOTMENT COST | = | MATERIAL COST | + | WORKING COST | |
| 2 | WORKING COST | = | PLATE LENGTH WORKING COST | + | PLATE WIDTH WORKING COST | |
| 3 | PLATE LENGTH DIFFERENCE | = | MATERIAL PLATE LENGTH | − | ORDERED PLATE LENGTH | |
| 4 | IF | PLATE LENGTH DIFFERENCE | ≦ | CONST1 | | |
| 5 | THEN | PLATE LENGTH WORKING COST | = | CONST2 | | |
| 6 | ELSE | PLATE LENGTH WORKING COST | = | CONST3 | ∗ | MATERIAL PLATE WIDTH |
| 7 | IF | MATERIAL PLATE WIDTH | = | ORDERED PLATE WIDTH | | |
| 8 | THEN | PLATE WIDTH WORKING COST | = | CONST 4 | | |
| 9 | ELSE | PLATE WIDTH WORKING COST | = | CONST 5 | ∗ | ORDERED PLATE LENGTH |
| 10 | ... | ... | ... | ... | ... | ... |

FIG. 18

| |
|---|
| DCL ORDER NO.(100), ORDERED PLATE WIDTH (100), ORDERED PLATE LENGTH (100); |
| DCL MATERIAL NO., MATERIAL PLATE WIDTH, MATERIAL PLATE LENGTH, MATERIAL COST; |
| READ CONST 1, CONST 2, CONST 3, CONST 4, CONST 5; |
| DO I = 1 TO 100; |
|    READ ORDER NO.(I), ORDERED PLATE WIDTH (I), ORDERED PLATE LENGTH (I); |
| END; |
| DO J = 1 TO 2000; |
|    READ MATERIAL NO., MATERIAL PLATE WIDTH, MATERIAL PLATE LENGTH, MATERIAL COST; |
|    DO I = 1 TO 100; |
|       PLATE LENGTH DIFFERENCE = MATERIAL PLATE LENGTH − ORDER PLATE LENGTH (I); |
|       IF PLATE LENGTH DIFFERENCE = CONST 1; THEN PLATE LENGTH WORKING COST = CONST 2; ELSE PLATE LENGTH WORKING COST = CONST 3 + MATERIAL PLATE WIDTH; |
|       IF MATERIAL PLATE WIDTH = ORDERED PLATE WIDTH (I); THEN PLATE WIDTH WORKING COST = CONST 4; ELSE PLATE WIDTH WORKING COST = CONST 5; |
|       WORKING COST = PLATE LENGTH WORKING COST; |
|       ALLOTMENT COST = MATERIAL COST + WORKING COST; |
|       WRITE ORDER NO.(I), MATERIAL NO., ALLOTMENT COST; |
|    END; |
| END; |

PLANNING SUPPORT METHOD AND SYSTEM

BACKGROUND OF THE INVENTION

This invention relates to a method of handling logics (planning logics) of planning software which goes through trial and error during preparation of a plan and more particularly to planning support method and system suitable for designing such plans as production plans having a variety of requirements involved, by frequently modifying existing planning software so that the software meets the requirements.

In the following description, a "plan" means procedure and contents of a working which are determined before the working is carried out, "planning software" is a planning program prescribing the procedure necessary for preparing or generating the plan, and a "planning logic" means specifications of the planning software. The planning software will hereinafter be termed a planning program.

In recent years, in designing various plans including production plans, quick designing of a well managed plan complying with a variety of needs has been required.

A planning apparatus conventionally used for preparing plans fetches information necessary for planning from the outside of the apparatus, evaluates the information in accordance with an evaluation function, and generates a plan in which evaluation values are optimized. However, because of the use of a predetermined planning logic (prescribing solving logics necessary for planning), the planning logic can not be modified to comply with situations and an optimum plan can not always be prepared.

There has been proposed in JP-A-No. 62-67669 (published on Mar. 27, 1987) filed in the name of the same assignee of the present application a planning support system in which the contents of a planning logic is divided into frequently modifiable constants and infrequently modifiable logics and these constants and logics are stored in separate files in a planning apparatus, thereby eliminating necessity of compiling the planning logic each time the constants are modified.

There has also been proposed in JP-A-No. 62-109158 (published on May 20, 1987) filed in the name of the same assignee of the present application another planning support system which comprises a process logic storage for storing frequently modifiable process logics of a planning logic and a solving logic storage for storing unmodifiable solving logics, thereby permitting a person in charge to modify the process logics in compliance with a modification being characteristic of a process and thus prepare a plan.

Any of the published literatures, however, fails to take account of preparing a program which is used to efficiently process planning information by fully reflecting the calculation sequence in the computer and memory capacity when a planning logic (especially, process logic) is executed.

In planning material allotment (for allotting a plurality of materials to a plurality of orders in one-to-one correspondence relationship) in a production plan, the cost of allotting a material to each order is calculated and based on a resulting cost matrix, a plan is prepared which is minimized in total cost. In this case, the planning logic is described in terms of a process logic describing calculation formulas for determining costs on the basis of a knowledge of process and a solving logic for effecting optimization calculation based on the cost matrix.

In order to execute the process logic with a computer, the manner of allotting data respresentative of a great number of orders and materials to memories, the manner of inputting/outputting data, the sequence of solving the cost calculation formulas (calculation sequence in the computer) and the designation of repetition in calculating all elements (costs) in the cost matrix are first determined and thereafter a program is prepared.

A first problem encountered in the aforementioned techniques resides in that the manner of memory allotment, the manner of data inputting/outputting, the calculation sequence and the manner of designating the repetition are not taken into consideration and so a knowledge of the computer and much time are required for preparing a program. A second problem of the techniques described hereinbefore is that even when modifying part, excepting constants, of a logic, the conventional compiling processing (checking of grammar throughout the logic and code generation) is needed and in addition, a message indicative of normality of grammar in the partly modified logic can not be outputted before all of the compiling processing (grammar checking, optimization and code generation) have been completed.

SUMMARY OF THE INVENTION

It is a first object of this invention to provide planning support method and system capable of planning, especially in handling a process logic, by extracting the calculation sequence from calculation formulas such as a cost matrix which is described regardless of the calculation sequence and preparing a highly efficient planning program suited to the amount of data to be processed, thereby solving the above-mentioned first problem.

It is a second object of this invention to provide planning support method and system capable of planning, especially in designing various plans such as working instructions to equipments, by checking only modified part of a planning logic for grammar, delivering an error message to a display unit to rapidly check the modified logic and preparing a planning program described in sequence by which the operation can be executed at high speeds, thereby solving the above-mentioned second problem.

According to the invention, to accomplish the first object, in a planning support system having a file for storing a planning program, a logic analyzer generates the calculation sequence by which a process logic included in a planning logic can be calculated with a general-purpose computer, a group of files store information representative of the amount and type of data to be processed pursuant to the process logic, and a planning program generator generates, on the basis of the contents of the group of files, a program which is added with proceedings for memory allotment, data inputting/outputting and repetitions calculation.

Specifically, the logic analyzer generates the calculation sequence by receiving the process logic and extracting the before-and-behind relation between calculation formulas for the process logic from variable contained in the calculation formulas.

The planning logic generator prepares the program prescribing proceedings necessary for execution of the process logic with the computer which are for the memory allotment, data inputting/outputting, calculation formulas aligned in the generated calculation sequence and repetition of the calculation formulas. With this construction, a planner can describe a process logic regardless of the calculation sequence, and the planning support system can prepare a program suited to the amount of data to be processed and execute the process logic, eventually ensuring quick planning.

According to the present invention, to accomplish the rapid delivery of the message regarding the modified logic recited in the second object, a pointer presents a sentence structure to be checked for grammar in unit of one line or several lines of a planning logic, the line or lines being checked for grammar in advance, and a modified logic checking unit checks only modified part for sentence structure each time the planning logic is modified and delivers a message indicative of an error in the checked sentence structure.

Further, to accomplish the rapid code generation during modification of the planning logic, an intermediate file stores the contents of a precedently checked logic, and a logic converter generates a code by renewing the contents of only modified part of the logic stored in the intermediate file.

Specifically, the pointer informs the modified logic checking unit of a sentence structure corresponding to a line of the modified logic, and the modified logic unit checks the modified part for grammar, ensuring that the modified logic can be checked for grammar without checking all of the planning logic for grammar.

The intermediate file stores intermediate results of grammar checking and is renewed with intermediate results stemming from only the modified part, so that the code generation for the modified planning logic can be executed without effecting wording analysis and sentence structure analysis throughout the planning logic.

BRIEF DESCRIPTION OF THE DRAWINGS

FIGS. 3A and 3B show an example of the contents of a planning information file;

FIG. 4 shows an example of the contents of a planning file;

FIG. 5 shows an example of the contents of a planning logic file;

FIGS. 6A and 6B show an example of the contents of a planning information item file;

FIG. 8 shows an example of the contents of a variable group file;

FIG. 9 shows an example of the contents of a calculation sequence file;

FIGS. 11A to 11D show memory allotment in a calculation memory;

FIG. 12 shows an example of the contents of a planning program file;

FIGS. 16A to 16C show examples of wording analysis on a modified line of the planning logic;

FIG. 17 shows an example of the contents of an intermediate file for a precedently prepared planning logic; and FIG. 18 shows an example of the contents of a planning program file.

DESCRIPTION OF THE PREFERRED EMBODIMENTS

Referring now to FIGS. 1 to 12 and FIG. 15, a first embodiment of the invention will be described.

A part working station referred to in this embodiment utilizes for for planning a computer which responds to information regarding orders and materials (hereinafter referred to as planning information) to prepare a plan managing the one-to-one correspondence allotment between order and material and managing an order from which working starts, and the station automatically controls a group of equipments in accordance with the plan to work parts.

Figure 2:
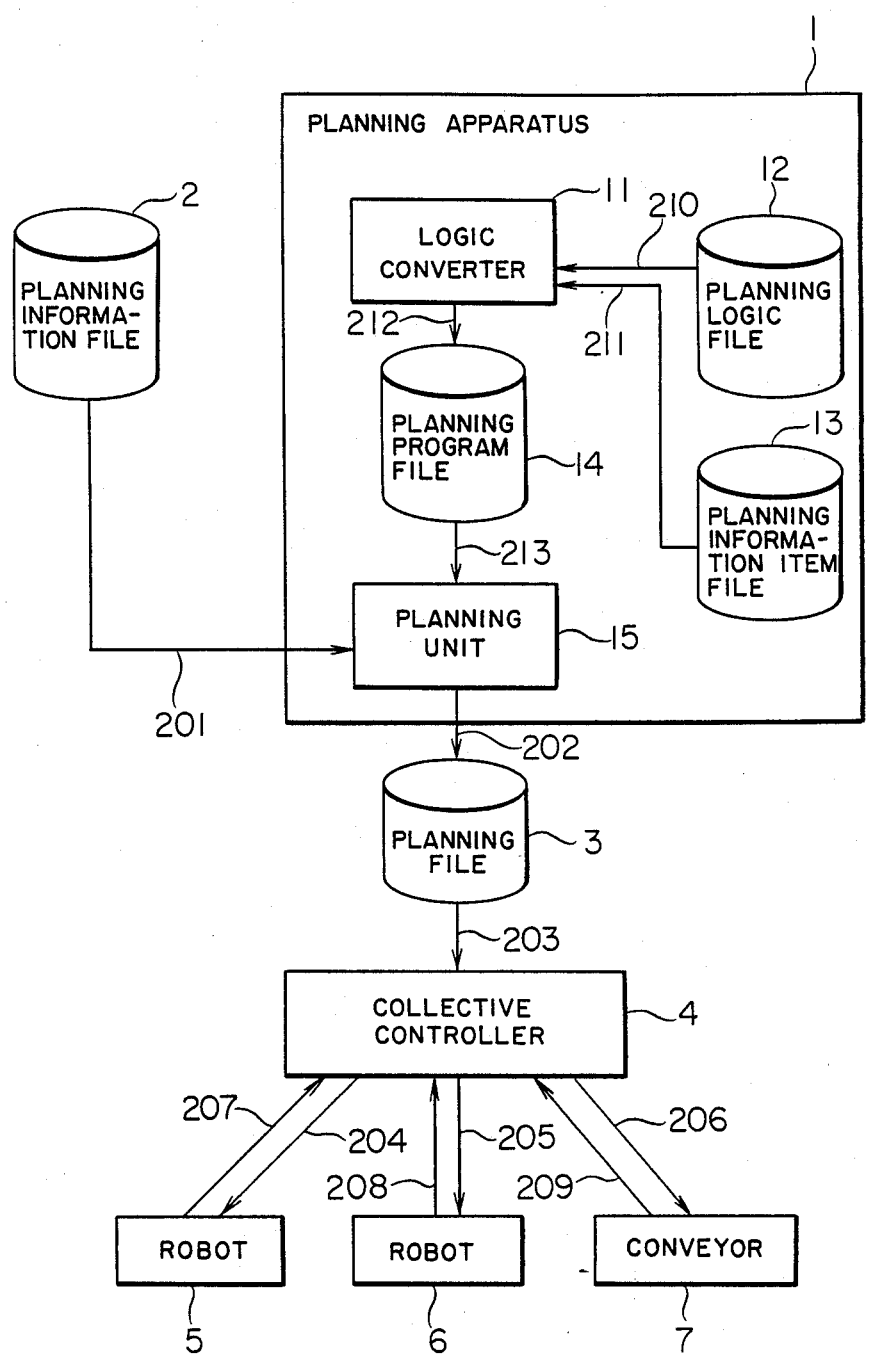
FIG. 2 is a block diagram schematically illustrating a working station to which the invention is applied.

This type of part working station to which the invention is applied is schematically illustrated, in block form, in FIG. 2. In this part working station, a planning apparatus 1 reads information (supplied externally of the planning apparatus and referred to hereinafter as planning information) from a planning information file 2 via a signal line 201 to prepare a plan and stores the plan into a planning file 3 via a signal line 202. A collective controller 4 reads the plan from the planning file 3 via a signal line 203 and controls a group of equipments 5, 6 and 7 via signal lines 204 to 209 so as to work parts.

Figure 15A:
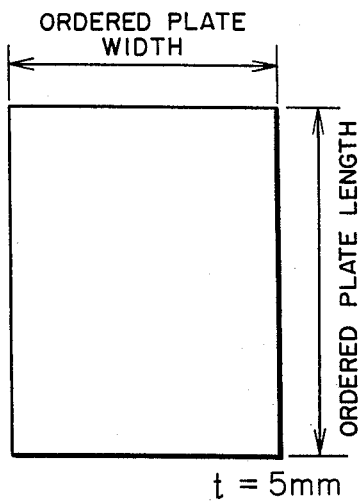
FIGS. 15A and 15B show an example of planning in the embodiment of the invention.
Figure 15B:
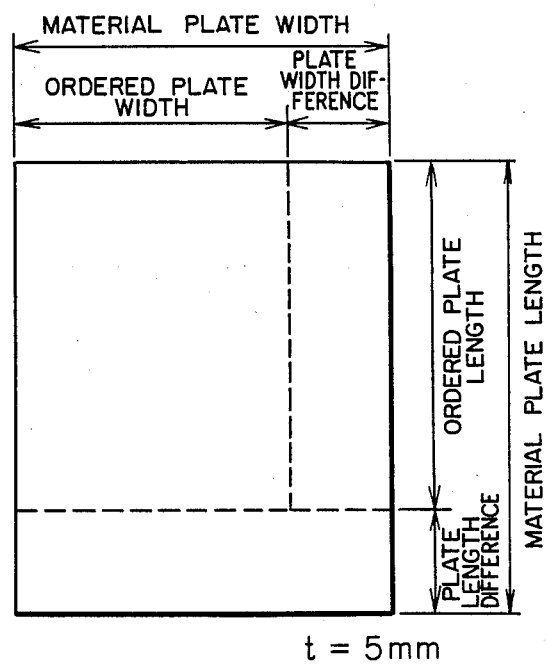

As an example of plan, an allotment plan is taken wherein a plurality of differently shaped inventorial plate materials are allotted to a plurality of orders for differently shaped plates in one-to-one correspondence relationship. In this planning, a material of a shape as shown in FIG. 15B having a plate thickness t of 5 mm, a plate width equal to a material plate width and a plate length equal to a material plate width is first allotted to an order for a plate of a shape as shown in FIG. 15A having a plate thickness 5 mm, a plate width equal to an ordered plate width and a plate length equal to an ordered plate length and a working cost of cutting surplus portions (plate width difference and plate length difference) is then calculated. Subsequently, a cost (allotment cost=material cost+working cost) incurred when a material is allotted to an order is calculated for all of combinations of planning information shown in FIGS. 3A and 3B, and an allotment plan (FIG. 4) for combinations of orders and materials is prepared such that costs of producing given ordered plates can be minimized.

The planning information is sorted into order information as shown in FIG. 3A which indicates values of input variables (data) in an order number item 301, an ordered plate width item 302 and an ordered plate length item 303 and material information as shown in FIG. 3B which indicates values in a material number item 304, a material plate width item 305, a material plate length item 306 and a material cost item 307. The planning file 3 has data indicative of combinations of order and material as shown in FIG. 4.

Specifically, in FIG. 4, data indicative of combinations of order and material are indicated in an order number item 401 and a material number item 402. For example, the first line in FIG. 4 indicates a combination wherein a plate of an order number "C1" is worked from a material of a material number "Z3".

Further, the logic used for preparing a plan from the planning information is called a planning logic. For example, the planning logic is specifications of a program for preparing an allotment plan.

The planning apparatus 1 for preparing a plan will specifically be described with reference to FIG. 2.

A logic converter 11 of the planning apparatus 1 reads a planning logic (FIG. 5) from a planning logic file 12 via a signal line 210 and the contents (FIGS. 6A and 6B) of a planning information item file 13 via a signal line 211, and a planning unit 15 reads planning information to prepare a plan. A planning program necessary for the preparation of the plan is stored in a planning program file 14 via a signal line 212 and applied to the planning unit 15 via a signal line 213.

The planning unit 15 of the planning apparatus 1 receiving the planning program delivered out of the logic converter 11 also receives the planning information in accordance with calculation sequence prescribed by the planning program and carries out calculation for preparation of the plan.

FIG. 5 shows a planning logic used in this embodiment. The planning logic exemplarily indicates calculation formulas used for calculating an "allotment cost" incurred when a material is allotted to an order, and the formulas are stored regardless of the calculation sequence.

The planning logic of FIG. 5 is equivalent to the contents of the planning logic file 12 and has data indicated in, for example, a line number item 51 indicative of the positions of calculation formulas, a calculation formula item 52 indicative of the contents of calculation and a pointer item 53 for checking grammar.

FIGS. 6A and 6B show a planning information item indicative of the amount of data in the planning information (ordered plate width, ordered plate length, material plate width, material cost and the like data) required for the planning logic in this embodiment. The planning information item is divided into information sorting as shown in FIG. 6A which has a sorting item 601, an information name item 602 and a data amount item consisting of a record length 603 indicative of the amount of data per event of order or material and the number of events 604 and information contents as shown in FIG. 6B which has an information sorting item 605, a data item 606 indicative of input data contained in information sorts enumerated in the item 605, a data length item 607 indicative of lengths of data in the item 606, a storage position item 608.

Figure 1:
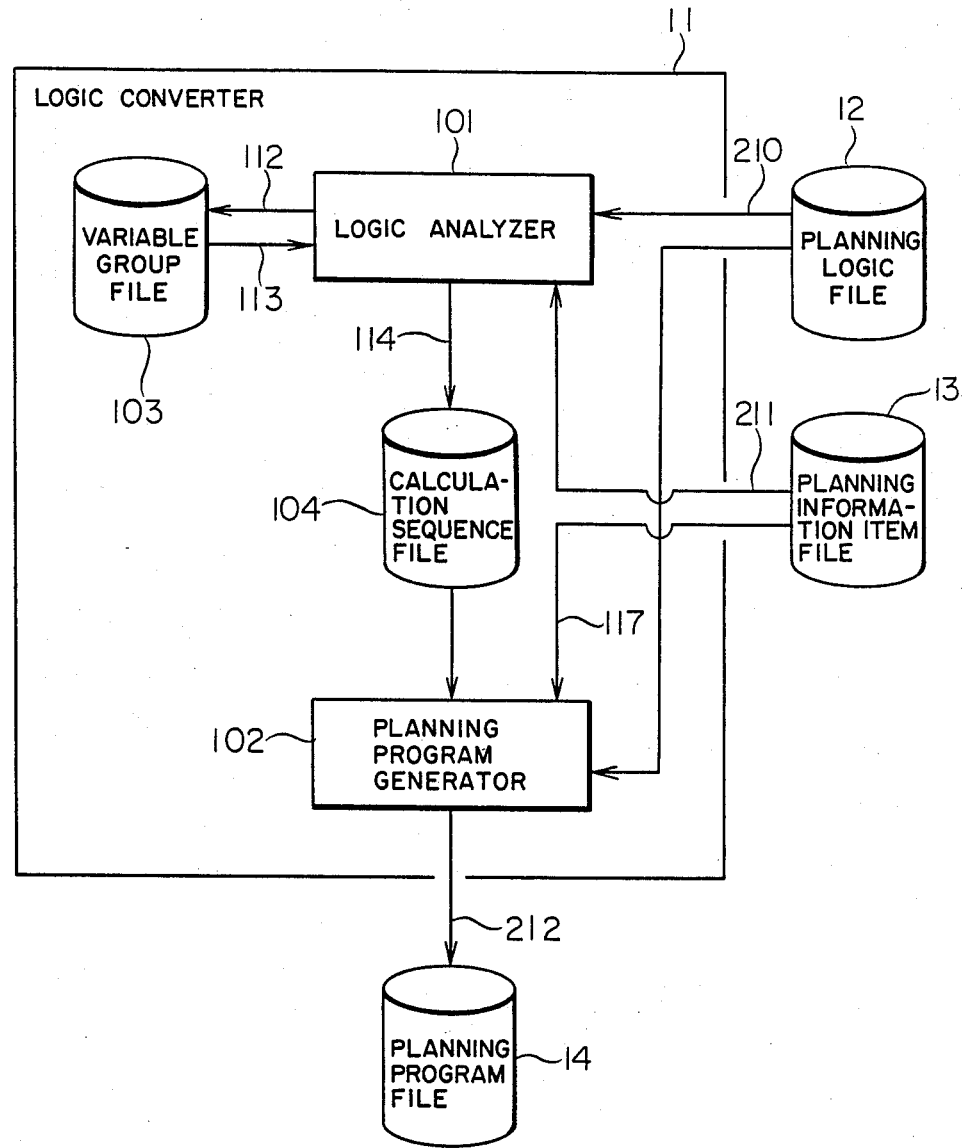
FIG. 1 is a block diagram schematically illustrating a logic converter according to a first embodiment of the invention.

The construction of the logic converter 11 will now be described with reference to FIG. 1 and FIGS. 7 to 9. FIG. 1 schematically illustrates in block form the logic converter, indicating that the logic converter 11 comprises a logic analyzer 101, a planning program generator 102, a variable group file 103, and a calculation sequence file 104.

Figure 7:
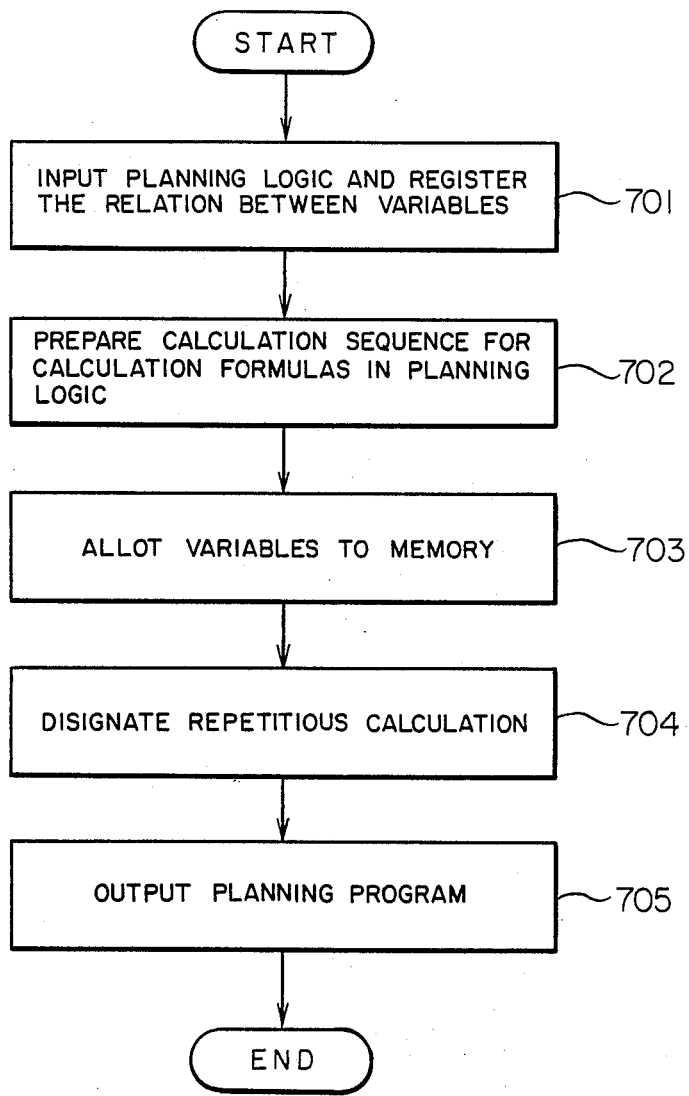
FIG. 7 is a flow chart illustrative of the operation procedure in the logic converter.

The operation of the logic converter 11 will be described with reference to an operational flow chart of FIG. 7. The logic converter 11 is started when the contents of the planning logic file 12 and the contents of the planning information item file 13 are registered or modified.

In step 701, the logic analyzer 101 reads the contents of the planning logic file 12 line by line via the signal line 210, extracts a key word (variable name and operator) contained in a calculation formula S1 described in the planning logic (for example, allotment cost=material cost+working cost in line 1, FIG. 5), analyzes a sentence structure and stores the relation between variables into the variable group file 103 via a signal line 112.

The contents of the variable group file 103 is illustrated in FIG. 8. The variable group file 103 is stored with a defined variable name 801 (variable name in the left side of a calculation formula, for example, allotment cost in line 1, FIG. 8), an undefined variable name 802 (name of variable of data necessary for the right side of a calculation formula or for calculation and not stored in the planning information item 606, for example, working cost in line 1, FIG. 8) and a position (line) number 803 at which the calculation formula is stored.

The logic analyzer 101 consults the data 606 in the planning information item file 13 via the signal line 211 so as to store into the variable group file 103 only variable names which are not found in the data 606 throughout the lines of the planning logic.

In step 702, the logic analyzer 101 searches for a defined variable (calculation formula) devoid of any undefined variable and which is stored in the variable group file and stores a name of the defined variable (for example, plate length difference in line 3, FIG. 8) and its line number in the calculation sequence file 104 (the first line in FIG. 9).

The contents of the calculation sequence file 104 is illustrated in FIG. 9. As shown, the defined variable 801 and the line number 803 of the variable group file 103 are stored at a calculation variable name item 901 and a line number item 902 in the calculation sequence file 104, in sequence by which they are calculable.

The logic analyzer 101 erases the variable name stored in the calculation variable name item of the calculation sequence file 104 (for example, the first line in FIG. 9) from the undefined variable item 802 of the variable group file 103 via a signal line 112 (plate length difference in the fourth line, FIG. 8 is erased). The logic analyzer 101 further searches for a defined variable 801 devoid of any undefined variable 802 and sequentially stores the thus found defined variables in the calculation sequence file 104 via a signal line 114, repeating this proceeding until a variable name to be eventually calculated (in this embodiment, allotment cost in the fifth line, FIG. 9) has been stored.

Figure 10:
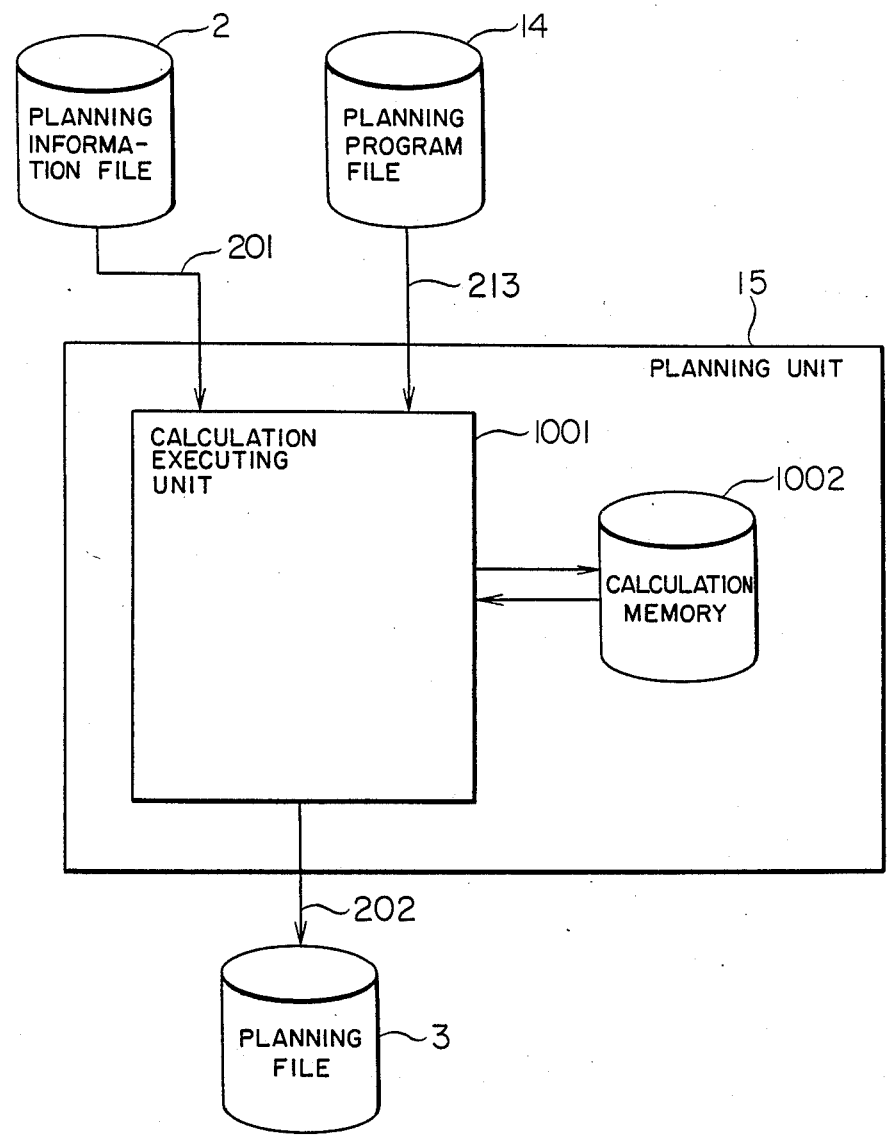
FIG. 10 is a block diagram schematically illustrating a planning unit.

FIG. 10 shows, in block form, the internal construction of the planning unit 15. The planning unit 15 comprises a calculation executing unit 1001 which responds to the contents of the planning program file 14 to perform reception of data in the planning information file 2, execution of calculation and delivery of results, a calculating memory 1002 for storing the received data.

In step 703, the planning program generator 102 receives from the data amount item 603, 604 of the planning information item file 13 amounts of data in the information (order, material), i.e., 200×100 and 150×2000, via a signal line 117, designates allotment of the data 606 of the planning information item suitable for the capacity of the calculating memory 1002 to the calculating memory 1002, and designates the manner of inputting data on the basis of the data length 607 and the storage position 608.

In step 704, the manner of repeating calculation formulas stored in the planning logic file 12 is designated in accordance with input sequence of the data.

For example, when planning the allotment between order and material as in the present embodiment, costs must be calculated for all combinations of order and material. If the amounts of any data in the planning information (data amounts for all events of order or material) exceed the capacity of the calculating memory 1002 and only data for each event can be inputted to the calculating memory 1002 of the planning unit 15 in order to calculate a cost of each combination, data 1111 for one event of order and data 1112 for one event of material are sequentially inputted as shown in FIG. 11A to cause the planning program generator 102 to prepare a planning program for execution of calculation. If the amounts of all data in the planning information do not exceed the capacity of the calculating memory 1002 and all the data can be inputted, data 1121 for all events of order and data 1122 for all events of material are read at a time as shown in FIG. 11B to cause the planning program generator 102 to prepare a planning program for execution of calculation. Further, if the amounts of data in the planning information (data amounts for all events of either order or material) do not exceed the capacity of the calculating memory 1002, data 1132 or 1141 for all events of one of the order and material are inputted at a time and data 1131 or 1142 for all events of the other of the order and material are inputted sequentially as illustrated in FIG. 11C indicating an instance wherein the amounts of data for order do not exceed the capacity of the calculating memory 1002 and in FIG. 11D indicating an instance wherein the amounts of data for material do not exceed the capacity of the calculating memory 1002, thereby causing the planning program generator 102 to prepare a planning program for execution of calculation.

In step 705, the thus prepared planning program is stored in the planning program file 14 via the signal line 212.

The contents of the stored planning program is illustrated in FIG. 12. The planning program shown in FIG. 12 is a program used for inputting data for 100 events of order at a time and executing calculation.

Stored in the planning program of FIG. 12 is a proceeding for allotting data in 100 events of order number 301, ordered plate width 302 and ordered plate length 303 and data in one event of material number 304, material plate width 305, material plate length 306 and material cost 307 to the calculating memory 1002 (steps 1201 and 1202). Following the above proceeding, a proceeding for inputting data in 100 events of order to the calculating memory 1002 at a time (steps 1203, 1204 and 1205), a proceeding for sequentially inputting data in each event of material and repeating calculation (steps 1206 and 1207) and a proceeding for repeating calculation for the order data stored in the calculating memory 1002 (step 1208) are stored in the planning program.

Further, a proceeding for executing calculation in sequence by which the calculation formulas for allotment cost are stored in the calculation sequence file 104 (steps 1209 to 1213) and a proceeding for outputting the calculated allotment cost (step 1214) are stored successively. Finally, a proceeding for ending repetition of calculation for the material and order data is stored (step 1215). In step 1216, the planning program ends.

As described above, according to the present embodiment, since the process logic included in the planning logic can be described regardless of the calculation sequence, the process logic can be described in sequence by which reading of the process logic can be facilitated, thereby improving efficiency of preparation of the process logic.

In addition, the logic converter built in the planning support system prepares a program for execution of the process logic in compliance with the items of data to be processed by the process logic, the type of the data and the amount of the data, with the result that the process logic can be executed and a plan can be prepared without assistance of a programmer or the like means.

For modifying the process logic, only the contents of the file in which the process logic has been stored needs to be modified. For modifying the amount of data to be processed by the process logic, it is also sufficient to modify the contents of the file storing the data amount, so that planning software (program) commensurate with the data amount can be prepared to reduce labor or man-hour required for maintaining the planning logic inclusive of the process logic.

In the present embodiment, the manner of inputting data has been described. But in a case wherein the amount of data to be outputted can precedently be calculated from the amount of data to be inputted, planning software (program) for execution of the process logic can be prepared in accordance with the manner of outputting complying with the amount of data to be inputted.

In the foregoing embodiment, controlling is automatically executed on the basis of a prepared plan but the invention is not limited thereto and may be applied to an instance in which a plan is displayed on a display unit and an operator manages controlling in accordance with the displayed plan. Also, in the foregoing embodiment, the logic converter 11 is started each time a plan is prepared. But, by starting the logic converter to newly prepare a planning logic only when checking of the amount of planning information and the contents of the planning information item by the planning unit 15 indicates that the contents is incompatible, processing time for logic conversion can be reduced when the amount of data in the planning information need not be modified.

A second embodiment of the invention will now be described.

Figure 14:
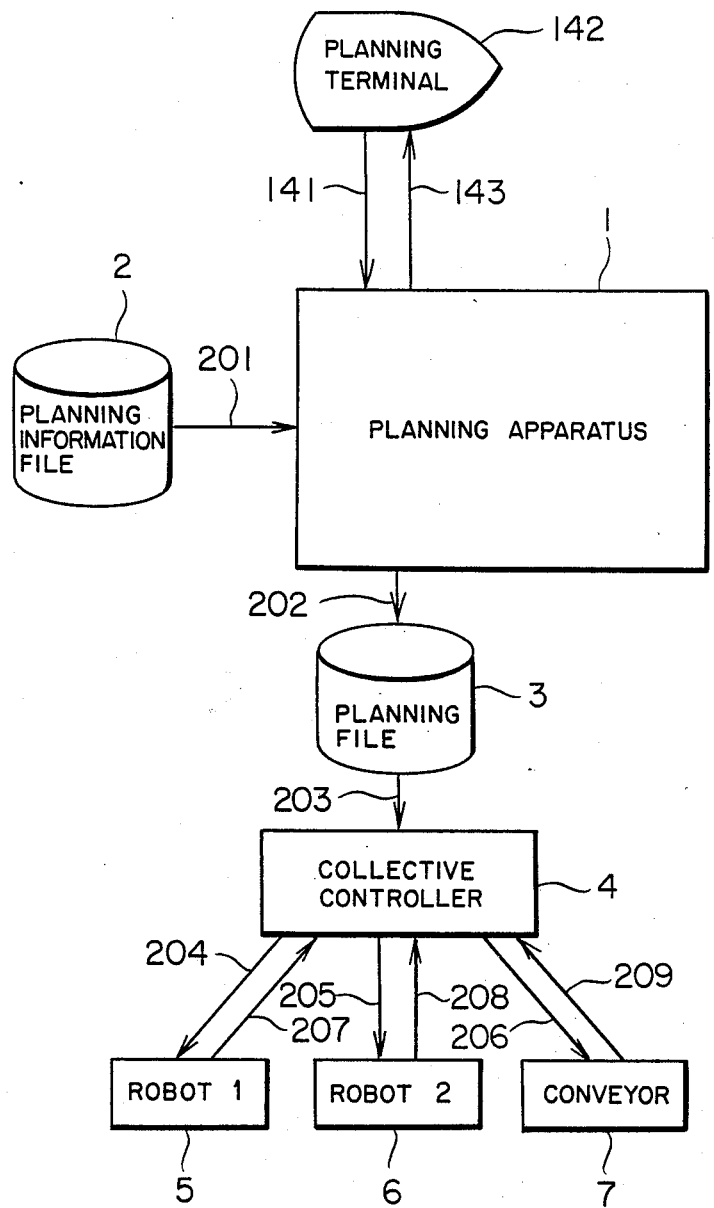
FIG. 14 is a block diagram schematically showing a working station to which the invention is applied.

As in the precedence, a part working station shown in FIG. 14 utilizes for planning a computer which responds to information regarding orders and materials, i.e., planning information to prepare a plan managing the one-to-one correspondence allotment between order and material and managing an order from which working starts, and the station automatically controls a group of equipments in accordance with the plan to work parts. As an example, planning resembles that shown in FIG. 2. Planning information similar to that used in the previous embodiment is externally applied to a planning apparatus. A logic available within the planning apparatus is called a planning logic which is equivalent to specifications of a program for preparing, for example, an allotment plan.

In this embodiment, a processing will be described in which a planning logic is modified to prepare a plan by which a group of equipments are controlled to work materials. The construction of the part working station to which the invention is applied will be described by referring to FIG. 14.

In this part working station serving as a system for planning and controlling the group of equipments, a planning terminal 142 starts a planning apparatus 1 via a signal line 141 so that a planning logic within the planning apparatus 1 may be displayed and modified. The planning apparatus 1 reads data in a planning information file 2 via a signal line 201, prepares a plan and stores the plan in a planning file 3 via a signal line 202. A collective controller 4 reads the plan from the planning file 3 via a signal line 203 and controls a group of equipments 5, 6 and 7 via signal lines 204 to 209 to work parts.

The internal construction of the planning apparatus 1 will be described with reference to FIG. 13.

Figure 13:
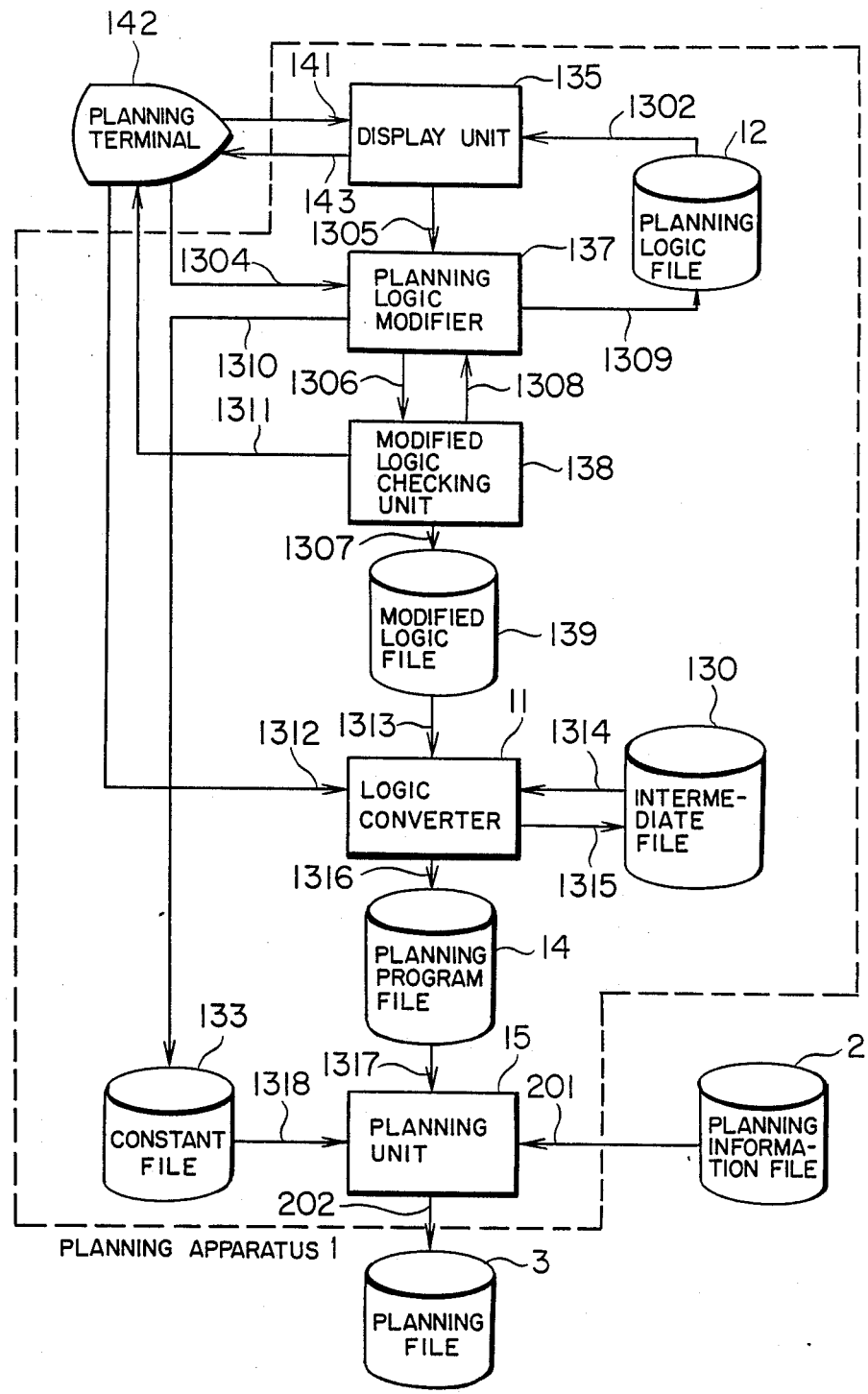
FIG. 13 is a block diagram schematically showing a planning apparatus according to a second embodiment of the invention.

Referring to FIG. 13, when a display unit 135 receives a request for displaying a planning logic from the planning terminal 142 via the signal line 141, it reads the planning logic to be displayed from a planning logic file 12 via a signal line 1302 and informs the planning terminal 142 via a signal line 143. A planning logic modifier 137 reads on the one hand a modified logic (after modification) on a modifying line from the planning terminal 142 via a signal line 1304 and reads on the other hand an unmodified logic (before modification) on the modifying line from the display unit 135 via a signal line 1305. Thus, the planning logic modifier 137 compares the modified and unmodified logics together to extract a modified portion. If grammar is correct, the planning logic modifier 137 writes the modified portion into a planning logic file 12 via a signal line 1309 so as to renew the planning logic. When constants are modified, the modifier 137 sends the modified constants to a constant file 133 via a signal line 1310 so as to renew the constant file 133. A modified logic checking unit 138 reads a planning logic for the modified portion via a signal line 1306 and checks grammar. If the grammar is correct, the modified logic checking unit 138 stores the modified logic in a modified logic file 139 via a signal line 1307 and sends a signal indicative of "correct grammar" to the planning logic modifier 137 via a signal line 1308. If the grammar is incorrect, the modified logic checking unit 138 sends an error message to the planning terminal 142 via a signal line 1311.

When the modification has been completed in respect of all planning logics, the planning terminal 142 sends a signal indicative of "modification end" to a logic converter 11 via a signal line 1312. The logic converter 11 being in receipt of this signal reads on the one hand all modified logics from the modified logic file 139 via a signal line 1313 and reads on the other hand unmodified (before modification) planning logics (the contents of an intermediate file 130) via a signal line 1314. Then, the logic converter 11 renews the contents of the intermediate file 130 with modified portions and stores the modified contents in the intermediate file 130 via a signal line 1315. The logic converter 11 prepares calculation sequence for the renewed planning logics and performs allotment to memory, thereby preparing a planning program (meaning the planning software described previously) which is executable by a planning unit 15. The planning program is stored in a planning program file 14 via a signal line 1316.

Subsequently, the planning unit 15 reads the planning program from the planning program file 14 via a signal line 1317, reads constant data from the constant file 133 via a signal line 1318, reads planning information from the planning information file 2 via the signal line 201, prepares a plan on the basis of the planning program, and stores the plan in the planning file 3 via the signal line 202.

A processing procedure effected by the planning logic modifier 137 to modify only a modified portion will now be described with reference to FIG. 5, FIGS. 16A to 16C and FIG. 17. Illustrated in FIG. 5 is an example of a planning logic which has precedently been checked for grammar. Each line is associated with a pointer which indicates a sentence structure of the corresponding line. For example, a pointer associated with the line number 2 is "1" indicative of a sentence structure in the form of a calculation formula and a pointer associated with the line number 6 is "4" indicative of a sentence structure in the form of an ELSE pharagraph of conditional branch. The planning logic modifier 137 reads on the one hand the modified logic (after modification) from the planning terminal 142 via the signal line 1304 and reads on the other hand the unmodified logic (before modification) from the display unit via the signal line 1305.

FIGS. 16A, 16B and 16C show an example of modification of the planning logic. Modified lines are subjected to wording analysis. FIG. 16A illustrates an unmodified logic (before modification) sent via the signal line 1305 and FIGS. 16B and 16C illustrate modified logics (after modification) sent via the signal line 1304. The planning logic modifier 137 performs wording analysis of the unmodified logic and modified logic to compare together wordings of the unmodified and modified logics.

In the case of comparison of FIG. 16A with FIG. 16B, the difference is seen only in constant described in the fourth term and a "constant modification" is determined so that only the modified constant is sent via the signal line 1310 to renew the constant file 133.

In the case of comparison of FIG. 16A with FIG. 16C, the difference is seen only in other than constant (operator) described in the fifth term and the modified logic and a pointer associated with the modified line are delivered to the modified logic checking unit 138 via the signal line 1306. The modified logic checking unit 138 checks a sentence structure of the logic on the modified line by using a pointer associated with the modified line.

In examples of FIGS. 16A, 16B and 16C, the value of pointer is "4" and the logic sentence structure is checked for a sentence structure in the form of an ELSE paragraph (a sentence structure of a calculation formula beginning with a key word "ELSE"). If incorrect, an error in sentence structure is determined and a message to the effect that the modification is erroneous is delivered to the planning terminal 142, thus requesting that the logic should be modified again.

Reference is now made to FIGS. 17 and 18 to explain a procedure for generating the contents of the planning program file 14 from the contents of the modified logic file 139.

FIG. 17 shows the contents of the intermediate file 130 described in respect of a precedently prepared planning program. The logic converter 11 responds to the signal indicative of "modification end" sent via the signal line 1312 to renew the contents of the intermediate file 130 with the contents of the modified logic file 139. In accordance with all the renewed contents of the intermediate file 130 in which the sentence structure has been checked, the logic converter 11 generates the calculation sequence and performs memory allotment to prepare a planning program which is to be executed by the planning unit 15, the planning program being stored in the planning program file 14 via the signal line 1316.

FIG. 18 shows the contents of the planning program file 14 in which calculation proceedings easy for the planning unit 15 to calculate are stored.

As described above, according to the present embodiment, immediately after the planning logic is modified in unit of line, only the corresponding line is checked for grammar. Therefore, in the case of incorrect grammar, an error message is sent quickly to the planning terminal to inform an error and hence the logic can be modified rapidly. Further, since the planning logic is modified in unit of line and wording analysis and sentence structure analysis are needed only for a modified portion, a plan can fast be prepared from a modified planning program.

In this embodiment, controlling is automatically executed on the basis of a prepared plan but the invention is not limited thereto and may be applied to an instance in which a plan is displayed on a display unit and an operator manages controlling in accordance with the displayed plan.

Although in the present embodiment the planning logic is checked for grammar in unit of line, part of a sentence structure in unit of plural lines or several wordings can be checked by providing a pointer which indicates the kind of sentence structure and the positional relationship.

In this embodiment, edition, conversion and execution of the planning logic are effected within the single planning apparatus but these functions may be shared for execution by several apparatus. Especially, in a planning system consisting of two apparatus respectively performing the edition and conversion of planning logic and the execution of planning logic, the modification of solving logic requires only the contents of modified part of logic as transfer data and transfer time for data can advantageously be reduced.

As is clear from the foregoing description, the present invention brings about the following effects.

(1) In the planning support system, the process logic describing a planning logic by utilizing a knowledge of process and the information on data to be processed pursuant to the process logic are stored in the files, and the logic converter (pre-compiler) receives the contents of the files to prepare a program, whereby the process logic can be executed under the direction of only the planner and accordingly the planning working can be simplified.

(2) Since the division of programmers does not participate in preparing planning programs, the responsibility for the execution of the process logic can be located clearly and reliability of the plan can be improved.

(3) Conventional type computers can be utilized efficiently because the logic converter (pre-compiler) generates the calculation sequence by which the computer is facilitated to calculate and prepares and executes a program by which the memory allotment of data to be processed can be effected in accordance with the capacity of a memory of the computer.

(4) The grammar is checked each time the modified logic checking unit of the planning apparatus modifies part of the logic and consequently, the planning terminal can be informed of a message indicative of a grammatical error in the modified part.

(5) In the planning apparatus, only modified part of logic is checked for grammar and the contents of the intermediate file which has precedently been checked for grammar is edited for the code generation. This considerably reduces time for frequent compiling of the planning logic.

Thanks to the effects enumerated in (4) and (5) above, the planning program (planning software) can be checked for grammar and at the same time modified, without being modified in entirety each time the planning logic is partly modified, and wording analysis and sentence structure analysis mainly occupying the compiling processing need to be undertaken only for the modified part, thereby ensuring that daily work for logic modification in planning services can be carried out quickly.

We claim:

1. A planning support system comprising:
    planning logic storage means, for storing a planning logic described without regard to a preparation sequence of a plan;
    logic conversion means for converting said planning logic into a planning program for the preparation of the plan; and
    planning means for preparing the plan in a desired sequence on the basis of said planning program and previously prepared planning information from a planning information storage means for storing planning information.

2. A planning support system according to claim 1 wherein said planning logic storage means includes planning information item storage means for storing the storage type and the amount of the information stored in said planning information storage means.

3. A planning support system according to claim 2 wherein said logic conversion means comprises logic analysis means for generating a calculation sequence by which calculation included in said planning logic is executed by said planning means, and planning program generation means for generating, on the basis of said planning logic and a planning information item, a procedure by which said planning information is inputted to said planning means and preparing said planning program in accordance with said calculation sequence.

4. A planning support system according to claim 3 wherein said logic analysis means includes variable group storage means for storing data indicative of the reference relation between variables contained in said planning logic.

5. A planning support method comprising steps of:
    storing a planning logic described without regard to a preparation sequence of a plan into a memory file;
    logic-converting said planning logic into a planning program for the preparation of the plan; and
    preparing the plan in a desired sequence on the basis of said planning program and previously prepared planning information.

6. A planning support method according to claim 5 wherein said step of storing a planning logic includes a step of storing a planning information item representative of the storage type and the amount of said planning information.

7. A planning support method according to claim 6 wherein said step of logic-converting comprises the steps of:
    logic-analyzing for generating a calculation sequence by which calculation included in said planning logic is executed by a means for planning; and a
    planning-program-generating for generating, on the basis of said planning logic and planning information item, a procedure by which said planning information is processed through said planning means and preparing said planning program in accordance with said calculation sequence.

8. A planning support method according to claim 7 wherein said step of logic analyzing includes a step of storing data indicative of the reference relation between variables contained in said planning logic.

9. A planning support system comprising:
planning logic storage means for storing a planning logic described without regard to a preparation sequence of a plan;
editing means for editing said planning logic;
logic conversion means for converting the edited planning logic into a planning program for the preparation of the plan; and
planning means for preparing the plan in a desired sequence on the basis of said planning program and previously prepared planning information.

10. A planning support system according to claim 9 wherein said editing means comprises display means for displaying the planning logic, modifying means for modifying said planning logic in accordance with a result of display, and checking means for checking whether a modified planning logic is correct or not.

11. A planning support system according to claim 10 wherein said checking means includes means for storing only the planning logic modified through the modifying means.

12. A planning support system according to claim 9 wherein said logic conversion means includes intermediate storage means for storing an unedited planning program (before edition) requiring modification 13. A planning support system according to claim 9 wherein said planning means includes constant storage means for storing only constants contained in said planning logic.

14. A planning support system according to claim 10 wherein said checking means includes means for changing, when a constant is modified, the corresponding constant stored in said constant storage means to a modified constant.

15. A planning support method comprising the proceedings steps of:
storing a planning logic described without regard to a preparation sequence of a plan;
editing said planning logic;
converting the edited planning logic into a planning program for the preparation of the plan; and
preparing the plan in a desired sequence on the basis of said planning program and previously prepared planning information.

16. A planning support method according to claim 15 wherein said proceeding of editing comprises the steps of:
displaying the planning logic;
modifying said planning logic in accordance with a result of display; and
checking whether a modified planning logic is correct or not.

17. A planning support method according to claim 16 wherein said step of checking includes a step of storing only the planning logic modified through the checking means into a modified logic file.

18. A planning support method according to claim 15 wherein said step of converting the edited planning logic includes a step of storing into an intermediate file an edited planning logic (after edition) in which only part of an unedited planning logic (before edition) requiring modification is renewed.

19. A planning support method according to claim 15 wherein said step of planning includes a step of storing only constants contained in said planning logic into a constant file.

20. A planning support method according to claim 16 wherein said step of checking includes a step of changing, when a constant is modified, the corresponding constant stored in said constant file to a modified constant.

* * * * *

UNITED STATES PATENT AND TRADEMARK OFFICE
CERTIFICATE OF CORRECTION

PATENT NO. : 4,839,803

DATED : June 13, 1989

INVENTOR(S) : Kazuhiro Kawashima, et al.

It is certified that error appears in the above-identified patent and that said Letters Patent is hereby corrected as shown below:

Claim 1, column 12, line 15, delete the ",".

Claim 7, column 12, line 64, delete the second occurrence of "a".

Claim 7, column 12, line 66, insert --a-- before the second occurrence of "planning".

Claim 15, column 14, lines 3 and 4, delete "proceedings".

Claim 16, column 14, line 14, delete "proceeding" and insert --step--.

Signed and Sealed this

Twentieth Day of February, 1990

Attest:

JEFFREY M. SAMUELS

Attesting Officer     Acting Commissioner of Patents and Trademarks